(12) United States Patent
Alhussien et al.

(10) Patent No.: US 9,367,389 B2
(45) Date of Patent: Jun. 14, 2016

(54) RECOVERY STRATEGY THAT REDUCES ERRORS MISIDENTIFIED AS RELIABLE

(71) Applicant: Seagate Technology LLC, Cupertino, CA (US)

(72) Inventors: AbdelHakim S. Alhussien, San Jose, CA (US); Erich F. Haratsch, Bethlehem, PA (US); Earl T. Cohen, Oakland, CA (US); Yunxiang Wu, Cupertino, CA (US)

(73) Assignee: Seagate Technology LLC, Cupertino, CA (US)

( * ) Notice: Subject to any disclaimer, the term of this patent is extended or adjusted under 35 U.S.C. 154(b) by 213 days.

(21) Appl. No.: 13/804,495

(22) Filed: Mar. 14, 2013

(65) Prior Publication Data

US 2014/0281767 A1 Sep. 18, 2014

(51) Int. Cl.

| G06F 11/10 | (2006.01) |
|---|---|
| H03M 13/45 | (2006.01) |
| G11C 29/52 | (2006.01) |
| G11C 16/34 | (2006.01) |

(52) U.S. Cl.
CPC ........ *G06F 11/1048* (2013.01); *G11C 16/3404* (2013.01); *G11C 29/52* (2013.01); *H03M 13/458* (2013.01); *G06F 11/1072* (2013.01); *G11C 16/34* (2013.01)

(58) Field of Classification Search
CPC ............ H03M 13/1111; H03M 13/45; H03M 13/458; G06F 11/1008; G06F 11/1068; G06F 11/1072; G11C 16/34
USPC .......................... 714/721, 752, 763, 773, 780; 365/185.24
See application file for complete search history.

(56) References Cited

U.S. PATENT DOCUMENTS

| 6,522,580 | B2 | 2/2003 | Chen et al. ............... 365/185.02 |
|---|---|---|---|
| 7,797,480 | B2 | 9/2010 | Mokhlesi et al. ............ 711/103 |
| 7,904,793 | B2 | 3/2011 | Mokhlesi et al. ............ 714/780 |
| 8,125,827 | B2 | 2/2012 | Park ........................ 365/185.09 |
| 8,243,511 | B2 | 8/2012 | Patapoutian et al. .... 365/185.02 |
| 8,250,437 | B2 | 8/2012 | Sakurada et al. ............... 714/64 |
| 8,274,823 | B2 | 9/2012 | Roohparvar et al. .... 365/185.02 |
| 8,312,354 | B1 * | 11/2012 | Varnica et al. ................ 714/780 |
| 8,332,576 | B2 | 12/2012 | Chu et al. ...................... 711/103 |
| 2008/0244162 | A1 | 10/2008 | Mokhlesi et al. ............ 711/103 |
| 2008/0250300 | A1 | 10/2008 | Mokhlesi et al. ............ 718/780 |
| 2011/0083060 | A1 * | 4/2011 | Sakurada et al. ............ 714/763 |
| 2011/0131473 | A1 | 6/2011 | Mokhlesi et al. ............ 714/773 |
| 2011/0209031 | A1 | 8/2011 | Kim et al. ..................... 714/763 |
| 2012/0063227 | A1 | 3/2012 | Weingarten et al. ...... 365/185.09 |
| 2012/0075930 | A1 | 3/2012 | Patapoutian et al. .... 365/185.03 |
| 2012/0079355 | A1 * | 3/2012 | Patapoutian et al. ......... 714/780 |

(Continued)

*Primary Examiner* — Albert Decady
*Assistant Examiner* — Christian Dorman
(74) *Attorney, Agent, or Firm* — Christopher P. Maiorana, PC (57) ABSTRACT

A method for applying a sequence of sensing/read reference voltages in a read channel includes (A) setting a read window based on an estimate of a read channel, (B) setting first, second, and third values of a sequence of sensing voltages to values corresponding to different ones of (i) a left-hand limit of the read window, (ii) a right-hand limit of the read window, and (iii) a point central to the read window, (C) determining whether first, second and third reads are successful, and (D) if the first, second and third reads are not successful, setting fourth and fifth values of the sequence of sensing voltages to values corresponding to different ones of (i) a point between the left-hand limit and the point central to the read window and (ii) a point between the right-hand limit and the point central to the read window.

20 Claims, 5 Drawing Sheets

(56) References Cited

U.S. PATENT DOCUMENTS

| | | | |
|---|---|---|---|
| 2012/0166913 A1* | 6/2012 | Alrod et al. | 714/773 |
| 2012/0221772 A1* | 8/2012 | Seol | G06F 13/16 711/103 |
| 2012/0236656 A1 | 9/2012 | Cometti | 365/185.22 |
| 2013/0003459 A1 | 1/2013 | Ulriksson et al. | 365/185.09 |
| 2013/0024605 A1 | 1/2013 | Sharon et al. | 711/103 |
| 2013/0024743 A1 | 1/2013 | Sharon et al. | 714/763 |
| 2013/0024746 A1 | 1/2013 | Sharon et al. | 714/766 |
| 2013/0024747 A1 | 1/2013 | Sharon et al. | 714/773 |
| 2013/0024748 A1 | 1/2013 | Sharon et al. | 714/773 |
| 2013/0229867 A1* | 9/2013 | Tang et al. | 365/185.2 |
| 2014/0047302 A1* | 2/2014 | Guo et al. | 714/773 |

* cited by examiner

FIG. 8 ns is too small, or when the second and
third applied sensing voltages are too close to the nominal
sensing voltage.

It would be desirable to have a recovery strategy that
reduces errors misidentified as reliable at each retry, which
would reduce the chance of needing more read retries than
necessary, as LDPC will be more likely to converge earlier in
the read retry process.

RECOVERY STRATEGY THAT REDUCES ERRORS MISIDENTIFIED AS RELIABLE

The present application is related to co-pending U.S. application Ser. No. 13/464,433, filed May 4, 2012, co-pending U.S. application Ser. No. 13/533,130, filed Jun. 26, 2012, co-pending U.S. application Ser. No. 13/721,739, filed Dec. 20, 2012, co-pending U.S. application Ser. No. 13/775,559, filed Feb. 25, 2013, and co-pending international application PCT/US2012/021682, international filing date of Jan. 18, 2012, all of which are incorporated by reference.

FIELD OF THE INVENTION

The invention relates to non-volatile memory management generally and, more particularly, to a method and/or apparatus for implementing a recovery strategy that reduces errors misidentified as reliable.

BACKGROUND

Different threshold voltage levels map to different bits in non-volatile memories. Due to noise, the actual threshold voltage levels for each state within a group of cells of a non-volatile memory page follow a distribution. Controllers of the non-volatile memory will model the threshold voltage distribution of each state. Some controllers use a parametric model for a "flash channel". The flash channel parameters change with use conditions, such as program and erase (P/E) cycles and retention. Therefore, the controllers track the channel parameters over time. However, the tracking operations consume bandwidth to the memory and utilize storage space for maintaining the channel parameters.

With aggressive scaling down of process technologies, the raw bit error rate (BER) of conventional NAND flash memories is becoming less reliable. To maintain the same level of reliability previously achieved before scaling down, solid state drive (SSD) and non-volatile memory controllers are adopting soft decoded error correction codes, such as low density parity check (LDPC) codes. Such codes are powerful in correcting errors, but need the input to the decoder to be a soft decision of the flash channels. A soft decision normally takes the form of a log-likelihood ratio (LLR). In order to obtain a high quality of a soft decision, multiple reads, often with varying read voltages, are necessary.

In a recovery mode, several sensing voltages are applied to the page cells in sequence in order to obtain a distinct multi-bit pattern that is then mapped to an LLR value to be passed to an LDPC decoder. Patterns that correspond to regions in which the threshold voltage is equally likely to come from either distribution result in a small LLR that approaches zero. On the other hand, when the threshold voltage is much more likely to belong to one distribution than another the LLR becomes very large in the positive or negative directions. However, the LLR is saturated at a certain value that is determined by the difference between the minimum and maximum sensing voltages. If the LLR is saturated but with the wrong sign due to large noise in that particular cell or due to write errors, then the LDPC decoder can be fooled by the resulting high magnitude LLR that results from the corresponding page multi-read retry. The problem is that even a small number of these high reliability errors can result in a higher LDPC error floor compared to the same channel quality when the high reliability errors are absent. The LLR can also be unnecessarily large and the corresponding errors misidentified as reliable when the window defined by the maximum and mini-

SUMMARY

The invention concerns a method for applying a sequence of sensing/read reference voltages in a read channel including (A) setting a read window based on an estimate of a read channel, (B) setting first, second, and third values of a sequence of sensing voltages to values corresponding to different ones of (i) a left-hand limit of the read window, (ii) a right-hand limit of the read window, and (iii) a point central to the read window, (C) determining whether first, second and third reads are successful, and (D) if the first, second and third reads are not successful, setting fourth and fifth values of the sequence of sensing voltages to values corresponding to different ones of (i) a point between the left-hand limit and the point central to the read window and (ii) a point between the right-hand limit and the point central to the read window.

BRIEF DESCRIPTION OF THE FIGURES

Embodiments of the invention will be apparent from the following detailed description and the appended claims and drawings in which:

DETAILED DESCRIPTION OF EMBODIMENTS

Embodiments of the invention include providing a method and/or apparatus for implementing a recovery strategy that reduces errors misidentified as reliable. The recovery strategy may (i) define a specific sensing order of a threshold voltage, (ii) apply sensing voltages in a special sequence, (iii) apply an initial sensing voltage other than the nominal sensing voltage farther from the nominal sensing voltage compared to later sensing voltages, (iv) reduce a chance of having high reliability errors in the first read retries, (v) reduce a chance that an error correction using low density parity code (LDPC) will fail early, (vi) increase the probability that error correction using LDPC will converge in a majority of cases with no more than three read retries, and/or (vii) be easy to implement.

Figure 1:
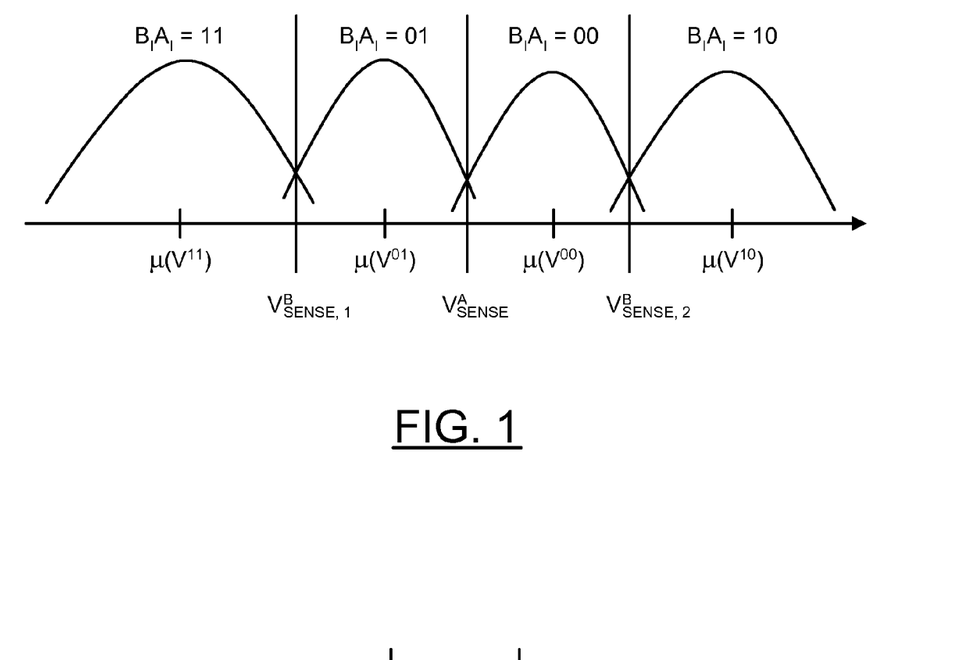
FIG. 1 is a diagram illustrating hard read operations of lower and upper pages of a multi-level cell.

Referring to FIG. 1, a diagram illustrating hard read operations of lower and upper pages of a multi-level cell is shown with four voltage levels. Extension of the examples described herein to more than four voltage levels would be straightforward to a person of ordinary skill in the art. Detection and decoding algorithms in the flash read channel are classified according to read and processing delay into on-the-fly methods and recovery methods. On-the-fly detection and decoding encompass processes that are invoked in a normal mode of operation. The normal mode is a mode in which only one hard page read is needed. The normal mode is the fastest mode of operation and, therefore, is run most of the time.

Using the hard read of flash page bits, the log-likelihood ratio (LLR) of a page bit to be 1 or 0 is calculated and passed to the soft decodable error correction code (ECC). In various embodiments, the soft decodable error correction code (ECC) is primarily a low-density parity check (LDPC) code. In this mode of operation a posteriori channel LLR of bit Bi is calculated by reading only bits in the same page and conditioned on specific channel indicators denoted by $\zeta$, where $\zeta$ encompasses the total effect of endurance, retention, and other channel impairments on the log-likelihood table look up function f $$\lambda_i^{post} = \begin{cases} -f(1, \zeta, b_i), & b_i = 1 \\ f(0, \zeta, b_i), & b_i = 0 \end{cases}$$

The look up function f is computed offline based on error statistics collected at a certain channel quality indicator $\zeta$. In cases where the channel information is not utilized or is not available, the LLR is simply calculated as, $$\lambda_i^{post} = \begin{cases} -\lambda, & b_i = 1 \\ \lambda, & b_i = 0 \end{cases},$$

where $\lambda$ is either chosen to minimize ECC failure probability, or simply set to the maximum possible soft input of the ECC, which depends on the fixed point representation of the ECC LLR input.

The hard read operation depends on whether an LSB (lower) or an MSB (upper) page is the target of the read command. When an LSB page is being read, the value of a bit (e.g., $a_i$), that belongs to the lower page (LSB), is determined based on whether the cell conducts or does not conduct when a sensing voltage (e.g., $V_{sense}^a$) is applied to the cell, as shown in FIG. 1.
Then, $$a_i = \begin{cases} 0, & V_t > V_{sense}^a \\ 1, & V_t < V_{sense}^a \end{cases},$$

where Vt is the threshold voltage of the cell, which is determined by the stored charge of the cell. On the other hand, the value of a bit (e.g., $b_i$), that belongs to the upper (MSB) page, is determined based on whether the cell conducts or does not conduct when two sensing voltages (e.g. $V_{1,sense}^b$ and $V_{2,sense}^b$) are applied to the cell, also a single hard read, then, $$b_i = \begin{cases} 0, & V_{2,sense}^b > V_t > V_{1,sense}^b \\ 1, & V_{1,sense}^b > V_t, V_t > V_{2,sense}^b, \end{cases}$$

In various embodiments, once LDPC fails to decode successfully in the normal mode of operation, the controller enters a more aggressive recovery mode where the controller attempts several hard reads of each page in order to obtain a quantized version of the threshold voltage of each cell in the page (e.g., see co-pending U.S. patent application Ser. No. 13/731,551, filed Dec. 31, 2012, entitled "MULTI-TIER DETECTION AND DECODING IN FLASH MEMORIES," which is incorporated herein by reference). Having access to this multi-bit estimate enables the calculation of more accurate LLR information and increases the possibility that soft-input ECC can converge to the correct codeword. Also, in generating the LLR, it is assumed that the distributions (or a simplified model thereof) of the cells are known before hand through characterization of the non-volatile memory (e.g., flash memory) for a specified channel quality indicator $\zeta$. Alternatively, a blind or a genie-based process is used to find a finite number of parameters such as the distribution first and second order statistics that fully characterize the distribution model.

Figure 2:
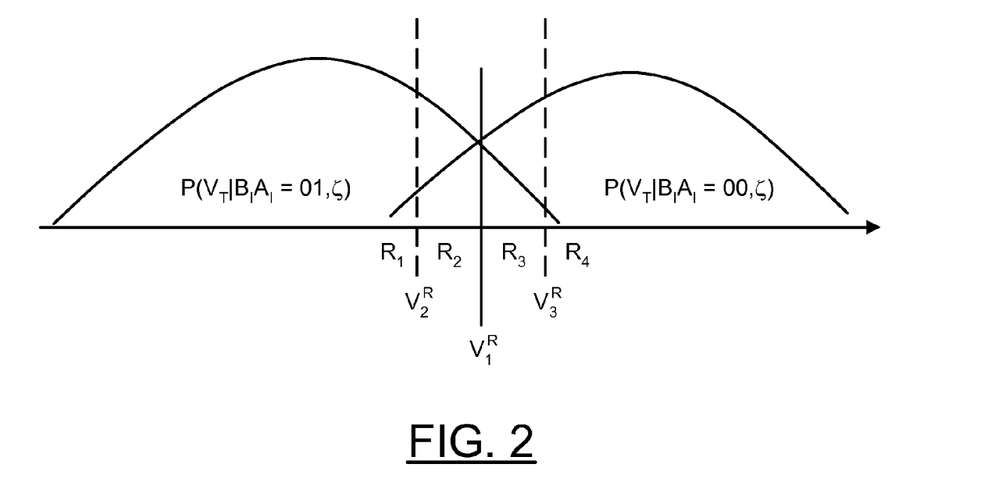
FIG. 2 is a diagram illustrating an example read window.

Referring to FIG. 2, a diagram is shown illustrating an example read window. In various embodiments, the sensing voltage is applied according to a specific order that avoids causing saturated LLR given a predefined read window. The predefined read window is generally defined by three threshold voltages (e.g., $V_1^r, V_2^r$ and $V_3^r$) In some embodiments, the threshold voltages $V_2^r$ and $V_3^r$ are placed symmetrically around $V_1^r$. The window size is generally defined by $|V_3^r - V_2^r|$.

Figure 3:
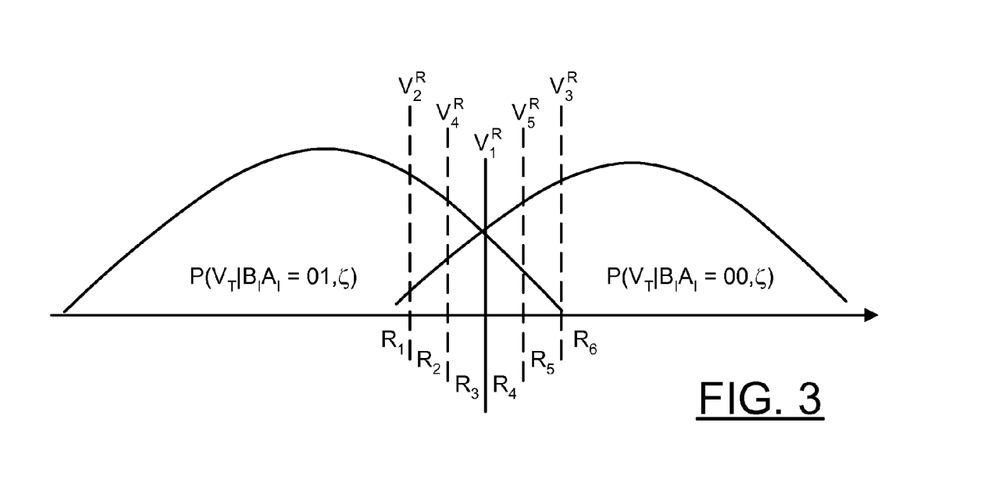
FIG. 3 is a diagram illustrating an exemplary sensing order of a threshold voltage in accordance with an embodiment of the invention.

Referring to FIG. 3, a diagram illustrating an exemplary sensing order of a threshold voltage in accordance with an embodiment of the invention is shown. FIG. 3 generally shows an exemplary implementation of the generation of LLR corresponding to 5 hard reads of the LSB page. In this process, five sensing voltages (e.g., $V_1^r$ to $V_5^r$) are applied in a special sequence, and define a number of regions (e.g., R1, . . . , R6). Depending on the conducting-non-conducting pattern generated in response to the five sensing voltages $V_1^r$ to $V_5^r$, the controller can determine in which region R1 through R6 the threshold voltage Vt resides.

For instance, if $V_t \in R_5$, then the log-likelihood of the LSB bit can be calculated using the following Equation 1:

$$\lambda_i^{post} = \log \frac{\int_{v_5^r}^{v_3^r} P(v_t \mid b_i a_i = 00, \zeta) dv_t}{\int_{v_5^r}^{v_3^r} P(v_t \mid b_i a_i = 01, \zeta) dv_t} \qquad \text{EQ. 1}$$

Equation 1 assumes no a-priori information is available about the LSB and MSB bits values, and that errors only occur between states '01' and '00'. However, given that extrinsic LLR is available as a result of previous global iterations, a more general formula may be summarized in the following Equation 2:

$$\lambda_i^{post} = \log \frac{\int_{v_3^r}^{v_5^r} P(v_t \mid b_i a_i = 10, \zeta) dv_t +}{\int_{v_3^r}^{v_5^r} P(v_t \mid b_i a_i = 00, \zeta) dv_t} \quad \text{EQ. 2}$$

The sequence is chosen so that the initial sensing voltages other than the nominal sensing voltage $V_1^r$ are further from the nominal sensing voltage $V_1^r$ compared to later-applied sensing voltages (e.g., $V_3^r > V_5^r$ and $V_2^r < V_4^r$. The ordering of sensing voltages in accordance with embodiments of the invention generally insures that there is less chance to have high reliability errors in the first read retries and thus there is less chance the LDPC process will fail early. If high reliability errors are the primary cause of LDPC failure, the ordering of the sensing voltages in accordance with embodiments of the invention increases the probability that three read retries will be sufficient for LDPC to converge in the majority of cases. However, if write errors occur, then no specific order given the same sensing window can prevent LLR saturation. In that case, increasing the window size defined by $|V_3^r - V_r^2|$ would improve the convergence probability.

Write errors in which one state is written instead of another can arise due to many mechanisms. In one mechanism the cell to be programmed can be stuck at a certain voltage level due to an open circuit, short circuit, or fault in the cell (e.g., due to wear out). In such cases the cell is "stuck" at the particular state irrespective of how many times the cell is erased and re-programmed. In another mechanism, transient write errors can arise in the programming sequence of multi-level cell (MLC) memories, such as MLC flash memories. In MLC flash memory, the LSB page of a wordline is strictly programmed first and the MSB page is programmed next. Before the MSB page is written, the LSB page is read to determine which intermediate state the cell is in, and then the two pages are written to the final level. If there is an error in reading the LSB page, then the cell will be written to a wrong state with high reliability. Write or stuck errors are difficult to correct with LDPC and other soft decoding codes because the voltage is written close to the mean of the Gaussian distribution of the wrong state. Hence, the LLR corresponding to resulting errors will likely have a large magnitude, and the LDPC decoder may not have enough side information to help flip the erroneous LLR even if many decoder iterations are performed.

Figure 4:
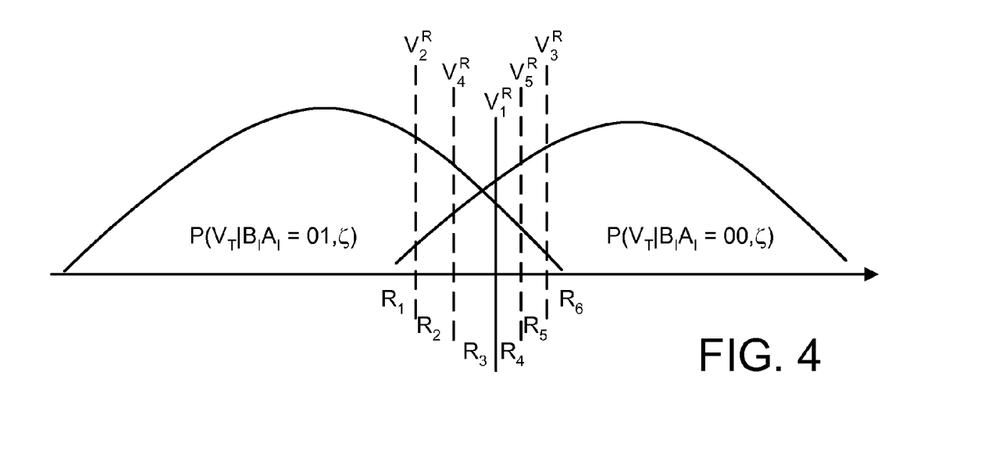
FIG. 4 is a diagram illustrating another exemplary sensing order of a threshold voltage in accordance with an embodiment of the invention.
Figure 5:
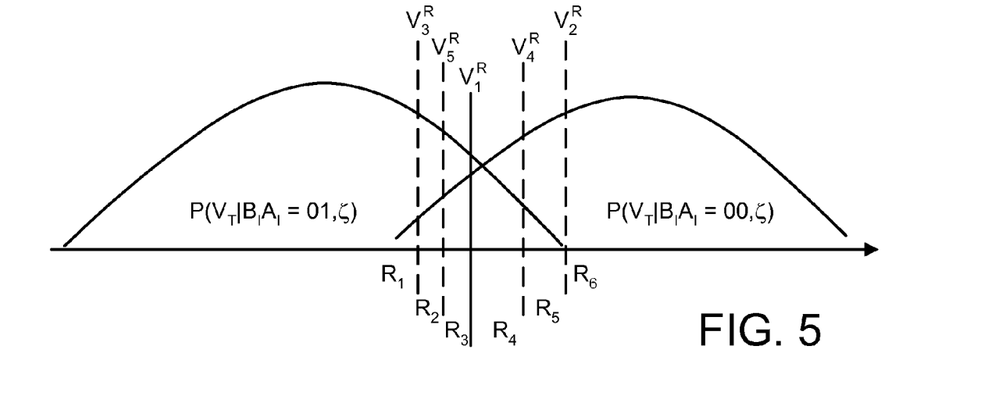
FIG. 5 is a diagram illustrating still another exemplary sensing order of a threshold voltage in accordance with an embodiment of the invention.

Referring to FIGS. 4 and 5, diagrams are shown illustrating exemplary sensing orders of threshold voltages (i) based on a prior read disparity above 0.5 (FIG. 4) and (ii) based on a prior read disparity below 0.5 (FIG. 5). In various embodiments, $V_1^r$ is applied first and placed according to one of many possible criteria in order to minimize the bit error rate (BER) at the input of the ECC decoder. In some embodiments, $V_1^r$ can be chosen such that the disparity is as close to 0.5 as possible, where the disparity is the ratio of 1's to the total number of bits in a page (whether 0 or 1). Then, $V_2^r$ and $V_3^r$ are placed on either side of $V_1^r$ (as illustrated in FIG. 2). The same criteria can be used to decide which of the threshold voltages $V_2^r$ or $V_3^r$ to apply next. For example, if $V_1^r$ is biased in one direction, above or below 0.5, the next voltage to be placed is the one further away from $V_1^r$ in the opposite direction, where $V_2^r$ and $V_3^r$ are no longer symmetric around $V_1^r$. The selection of the next voltage placement as the voltage further away from $V_1^r$ generally ensures that the read retry window is encompassing the intersection of the tails of the Gaussian distributions and is not shifted off center in a direction that results in more high reliability errors in one direction. In the same token, the values of all of the threshold voltages $V_2^r$, $V_3^r$, $V_4^r$, and $V_5^r$ may be determined dynamically based on the prior reads and the respective disparity. For example, FIG. 4 shows example values of the threshold voltages $V_2^r$, $V_3^r$, $V_4^r$, and $V_5^r$ when the disparity due to $V_1^r$ placement is above 0.5, and FIG. 5 shows example values of the threshold voltages $V_2^r$, $V_3^r$, $V_4^r$, and $V_5^r$ when the disparity due to $V_1^r$ placement is below 0.5.

Figure 6:
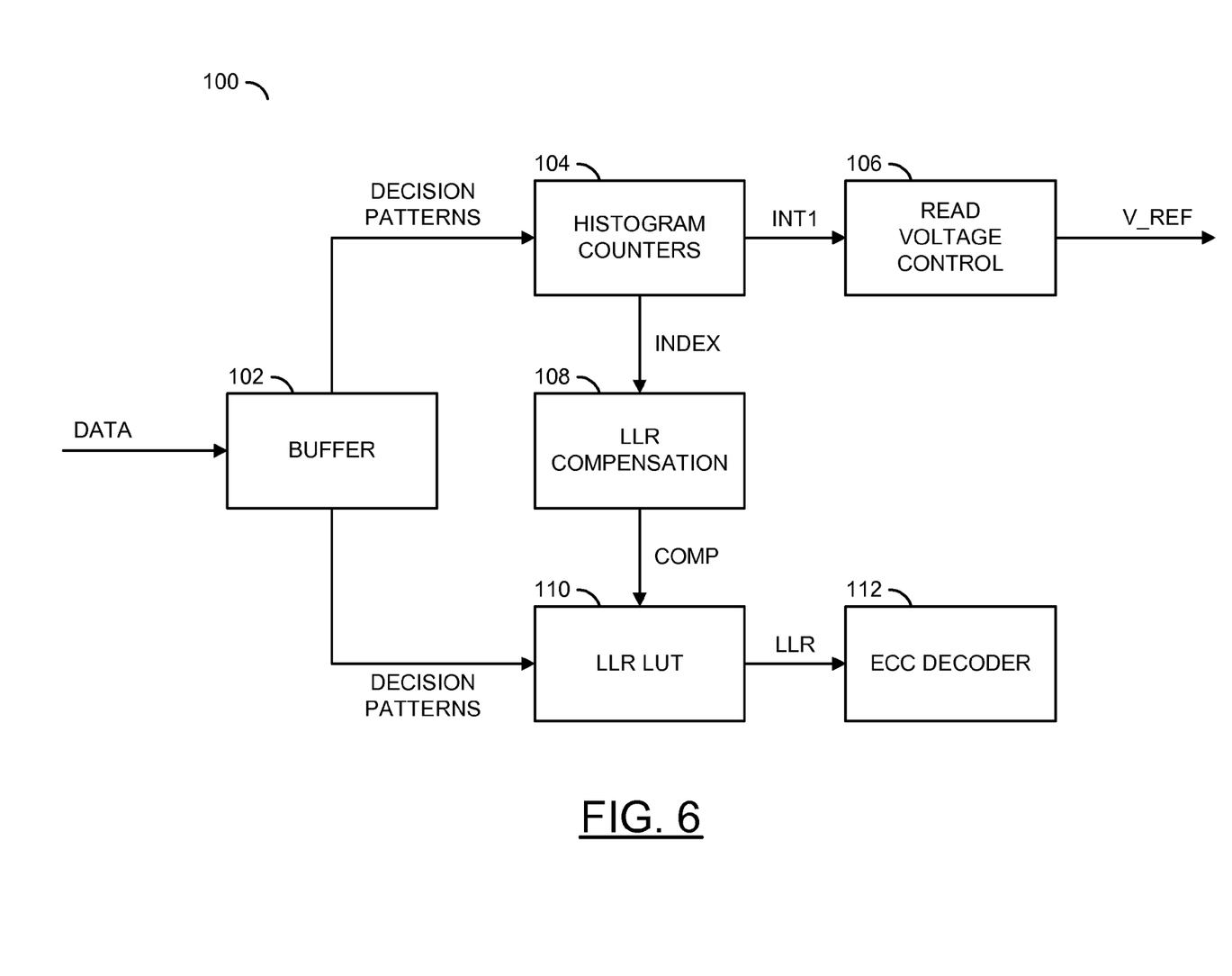
FIG. 6 is a diagram illustrating an embodiment of the invention.

Referring to FIG. 6, a block diagram of a circuit 100 is shown in accordance with an embodiment of the present invention. The circuit 100 generally comprises a block (or circuit) 102, a block (or circuit) 104, a block (or circuit) 106, a block (or circuit) 108, a block (or circuit) 110, and a block (or circuit) 112. The circuit 102 may be implemented as a buffer circuit. The circuit 104 may be implemented as a histogram counter circuit. The circuit 106 may be implemented as a read voltage control circuit. The circuit 108 may be implemented as an LLR compensation circuit. The circuit 110 may be implemented as an LLR look-up table (LUT) circuit. The circuit 112 may be implemented as an ECC decoder circuit. The buffer circuit 102 may receive the signal (e.g., DATA). The signal DATA may be a series of read back data operations received from a non-volatile memory circuit. The buffer circuit 102 may generate a signal (e.g., DECISION_PATTERNS) that may be presented to the circuit 104 and/or the circuit 110. The circuit 104 may present a signal (e.g., INT1) to the circuit 106. The circuit 104 may also present a signal (e.g., INDEX) to the circuit 108. The circuit 108 may present a signal (e.g., COMP) to the circuit 110. The circuit 110 may present a signal (e.g., LLR) to the circuit 112.

The circuit 100 may implement a process that progressively gains knowledge of the distributions during retry reads by applying a number of levels of the signal V_REF according to a sequence in accordance with an embodiment of the present invention. Using the updated knowledge, the values of the signal V_REF used for successive reads are optimized to be closer and closer to the desired values. The circuit 100 may implement a recovery strategy that reduces errors misidentified as reliable. In some embodiments, the recovery strategy enables a channel detector to adaptively determine the next value of the signal V_REF based previous reads (e.g., described above in connection with FIGS. 4 and 5).

The circuit 100 may (i) reduce the number of retry reads to improve throughput performance, and/or (ii) improve retry reliability (intelligent rather than blind). The circuit 100 may be used together with conventional ECC circuits and/or advanced soft decoded ECC techniques.

One challenge in a detector design of flash channels is dealing with channel variations (e.g., the time-variant nature of the distributions). Although various channel tracking processes may be used, there is no guarantee on the tracking accuracy of each individual page. Lack of tracking accuracy poses a threat to the reliability of a solid state drive (SSD) device.

The circuit 100 may provide a powerful process for fighting the time-variant nature of NAND flash channels. With the circuit 100, the channel detector is able to adaptively learn the distribution of cell voltages. The circuit 100 is very simple and feasible for implementation. The main hardware/software may include counters for tracking the occurrence of the decision patterns. The circuit 100 greatly improves detection/decoding reliability of pages where channel distributions cannot be accurately tracked.

The task of a channel detector includes two general parts (i) determining the values of the signal V_REF for maximizing channel capacity and/or (ii) calculating the soft decisions corresponding to the values of the signal V_REF. The task is easier to fulfill if the distributions are accurately known. With a predictable distribution, the circuit 100 may not need to focus on how to maximize channel capacity and/or how to calculate soft decisions. Rather, the circuit 100 may be used to progressively update the knowledge of the distributions in an effort to fulfill the task of a detector.

The circuit 100 may be used to calculate read voltages, decision regions, hard decision patterns and/or a decision histogram. The number of decision patterns is normally N+1 for N reads of a lower page. For an upper page, there are a maximum of 2*N hard decision patterns since a pair of read voltages is used for each read. For example, using three reads as shown in FIG. 1, there will be three binary bit sequences obtained after the three reads. These sequences should be stored in a data buffer for further processing. Relevant hardware should be built to count the frequency of occurrence of the decision patterns.

The count of the frequency of occurrence of the decision patterns is actually a histogram of the decision patterns. Knowledge of the channel can be updated using the histogram. For the first read (e.g., as shown in FIG. 3), the threshold voltage is either (i) set to the equilibrium point between the two distributions (e.g., $V_1^r$), (ii) set to the left-hand limit of the read window (e.g., $V_2^r$), or (iii) set to the right-hand limit of the read window (e.g., $V_3^r$). Consider an example where the first read uses the voltage V_REF=$V_1^r$, as shown in FIG. 3. If the first read fails, then the read voltage is set to V_REF=$V_2^r$. If the second read fails, the next read voltage is set to V_REF=$V_3^r$. In some embodiments, decoding of data of the second read is performed as a soft-decision decode using LLR values according to data of the first and second reads.

If error correction decoding fails for the third read, the value of the signal V_REF for the fourth read is set to a value between $V_2^r$ and $V_1^r$ (e.g., $V_4^r$) In some embodiments, decoding of data of the third read is performed as a soft-decision decode using LLR values according to data of the first, second, and third reads. After the fourth read, a histogram of five bins will be available, which in turn allows a further estimate about an accurate equilibrium point. This newly gained knowledge will be helpful in determining the next value of the signal V_REF (e.g., $V_5^r$) and for compensating the LLRS in case where a soft ECC is implemented.

The recovery strategy implemented by the circuit 100 may be applied to a variety of systems. For example, a system may be used with a soft ECC (such as LDPC) or a conventional ECC (such as BCH). FIG. 6 shows an example of the circuit 100 using a soft ECC. When a read (detection) starts, the read voltage control circuit 106 sets the signal V_REF based on existing estimation of the channel (e.g., cell voltage distributions). If the read fails, successive reads varying the signal V_REF are performed. The data of the multiple reads are stored in the buffer circuit 102. Before each successive read, the signal V_REF for the on-going read should be adjusted according to the histogram of previous reads. The LLR lookup table (LUT) 110 is normally prepared based on the latest estimation of the channel (e.g., updated by the histogram of the previous reads). With this architecture, the read voltage control circuit 106 determines a value of the signal V_REF for a subsequent read with more and more accuracy along with the increased number of retries. Conventional retry schemes recommended by NAND manufactures merely try some random values for varying the signal V_REF around the original estimation.

Figure 7:
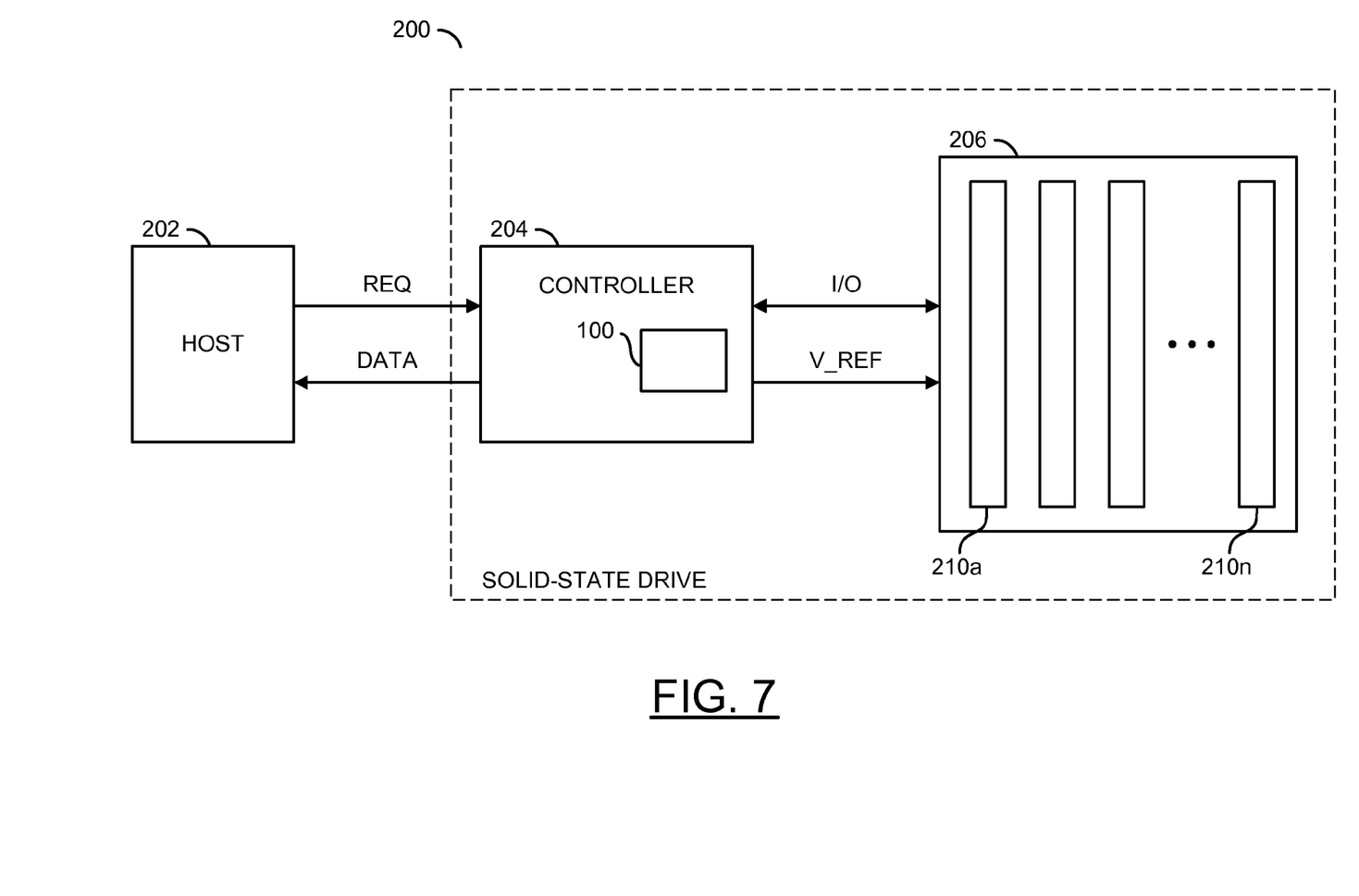
FIG. 7 is a diagram illustrating a context of an embodiment of the invention.

Referring to FIG. 7, a block diagram of an example apparatus 200 is shown. The apparatus 200 may implement a computer having a non-volatile memory circuit. The apparatus 200 generally comprises a block (or circuit) 202, a block (or circuit) 204 and a block (or circuit) 206. The block 204 may include the circuit 100.

A signal (e.g., REQ) may be generated by the circuit 202. The signal REQ may be received by the circuit 204. The signal REQ may be a request signal that may be used to access data from the circuit 206. A signal (e.g., I/O) may be generated by the circuit 204 to be presented to the circuit 206. The signal V_REF may be sent to the circuit 206. In one example, the signal V_REF may be sent on a discrete data line. In another example, the signal V_REF may be sent as part of the signal I/O. The signal REQ may include one or more address bits. A signal (e.g., DATA) may be one or more data portions received by the circuit 202.

The circuit 202 is shown implemented as a host circuit. The circuit 204 reads and writes data to and from the circuit 206. The circuit 206 is generally implemented as a non-volatile memory circuit. The circuit 206 may include a number of modules 210a-210n. The modules 210a-210n may be implemented as NAND flash chips. In some embodiments, the circuit 206 may be a NAND flash device. In other embodiments, the circuit 204 and/or the circuit 206 may be implemented as all or a portion of a solid state drive (SSD) device having one or more non-volatile memory devices. The circuit 206 is generally operational to store data in a non-volatile condition. When data is read from the circuit 206, the circuit 204 may access a set of data (e.g., multiple bits) identified in the signal REQ.

In some embodiments, the circuit 206 may be implemented as a single-level cell (e.g., SLC) type circuit. An SLC type circuit generally stores a single bit per memory cell (e.g., a logical 0 or 1). In other embodiments, the circuit 206 may be implemented as a multi-level cell (e.g., MLC) type circuit. An MLC type circuit is generally capable of storing multiple (e.g., two) bits per memory cell (e.g., logical 00, 01, 10 or 11). In still other embodiments, the circuit 206 may implement a triple-level cell (e.g., TLC) type circuit. A TLC circuit may be able to store multiple (e.g., three) bits per memory cell (e.g., a logical 000, 001, 010, 011, 100, 101, 110 or 111).

The signal REQ generally spans an address range of the circuit 206. The address range may be divided into multiple groups (or regions). Each group may be divided into one or more sets of data. Each set of data generally incorporates multiple memory cells. The signal I/O may write/read an entire set (or ECC codeword) to/from the circuit 206.

Figure 8:
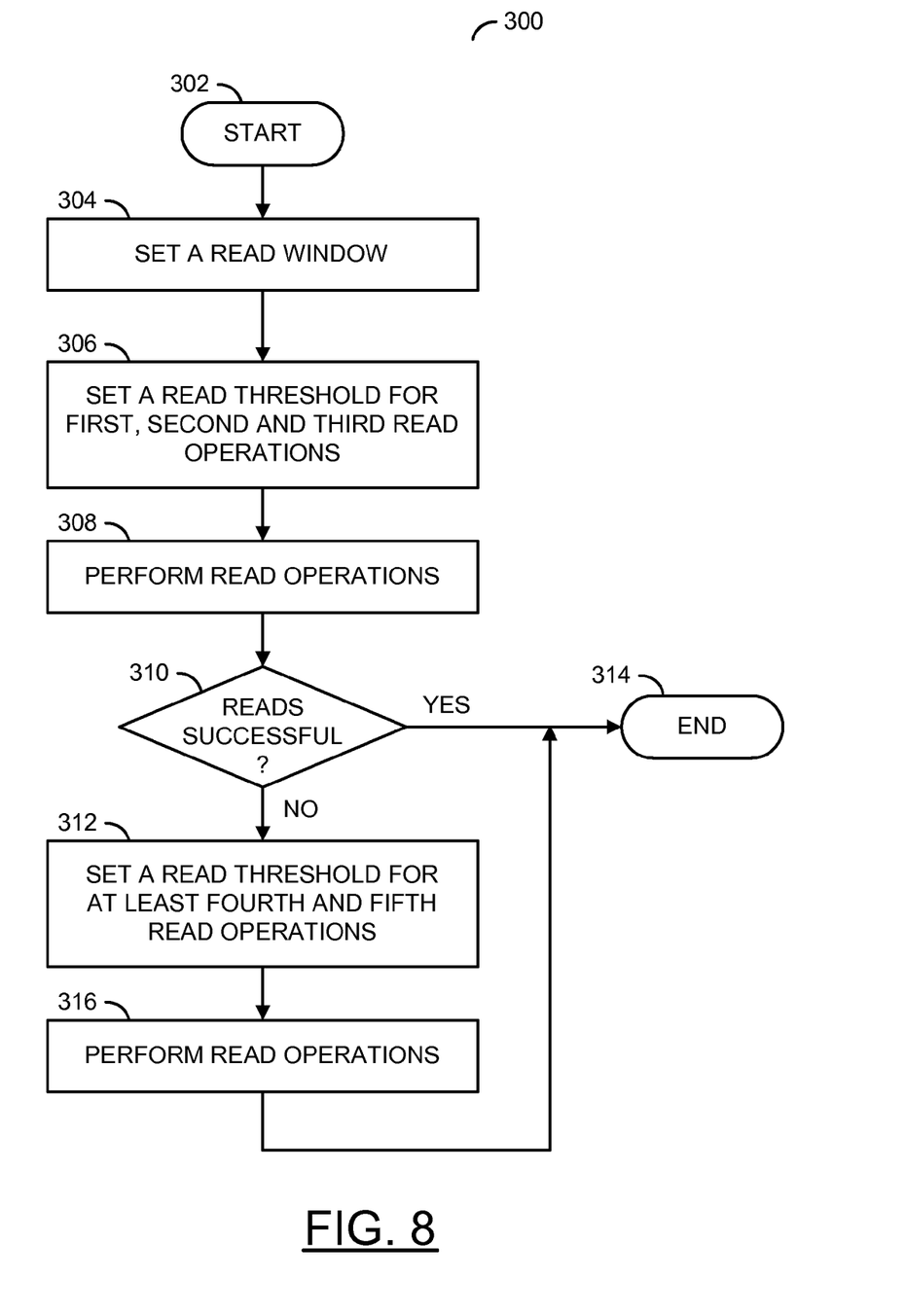
FIG. 8 is a flow diagram of an embodiment of the invention.

Referring to FIG. 8, a flow diagram illustrating a process 300 in accordance with an embodiment of the invention is shown. The process (or method) 300 generally implements a recovery strategy that reduces errors misidentified as reliable. In various embodiments, the process 300 applies a sequence of threshold voltages in a read channel of a non-volatile memory, where the sequence of threshold voltages is configured to avoid causing a saturated log-likelihood ratio (LLR) for the read window. In some embodiments, the process comprises a step (or state) 302, a step (or state) 304, a step (or state) 306, a decision step (or state) 308, a decision step (or state) 310, a decision step (or state) 312, a step (or state) 314, and a step (or state) 316. The step 302 may be a start state. The step 304 may set a read window. The step 306 may set a first value, a second value, and a third value of the sequence of threshold voltages for a first read, a second read and a third read. The first value, the second value, and the third value generally correspond to different ones of (i) a left-hand limit of the read window, (ii) a right-hand limit of the read window, and (iii) a point central to thre read window. The step 308 may perform the first, second and third read operations. The step 310 may determine whether the first, second and third read operations were successful. If (all of) the first, second, and third read operations were not successful, the process 300 moves to the step 312. Otherwise, the process 300 moves to the step 314 and terminates.

In the step 312, the process 300 sets a fourth value and a fifth value of the sequence of threshold voltages for a fourth read and a fifth read. The fourth value and the fifth value generally correspond to different ones of (i) a point between the left-hand limit of the read window and the point central to the read window and (ii) a point between the right-hand limit of the read window and the point central to the read window. In the step 316, the fourth and fifth read operations are performed and the process 300 moves to the step 314 and terminates. In some embodiments, decoding is attempted after the fourth read (according to data of the first, second, third, and fourth reads), and if the decoding is successful, the process 300 terminates without one or more of performing the fifth read and decoding data of the fifth read.

The functions performed by the diagram of FIG. 8 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. A method for applying a sequence of sensing/read reference voltages in a read channel, comprising the steps of:
   setting a respective read window for each respective threshold voltage of a set of threshold voltages defining different states of a memory cell storing multiple bits based on an estimate of the read channel, wherein each respective read window for each respective threshold voltage is set to encompass an intersection of two threshold voltage distribution tails associated with each respective threshold voltage;
   setting a first value, a second value, and a third value of the sequence of read reference voltages for a first hard read, a second hard read and a third hard read of each respective read window, wherein the first value corresponds to a point central to the respective read window, and the second and third values correspond to different ones of a left-hand limit of the respective read window and a right-hand limit of the respective read window;
   determining whether the first, the second and the third hard reads of each respective read window are successful; and
   if the first, the second and the third hard reads are not successful, setting a fourth value and a fifth value of the sequence of read reference voltages for a fourth hard read and a fifth hard read of each respective read window, the fourth value and the fifth value corresponding to different ones of (i) a point between the left-hand limit of the respective read window and the point central to the respective read window and (ii) a point between the right-hand limit of the respective read window and the point central to the respective read window.

2. The method according to claim 1, wherein the read channel is implemented in a non-volatile memory.

3. The method according to claim 2, wherein the memory comprises a flash memory.

4. The method according to claim 2, wherein the memory comprises a NAND flash memory.

5. The method according to claim 2, wherein the memory comprises a plurality of modules.

6. The method according to claim 2, wherein the memory is part of a solid state drive (SSD).

7. The method according to claim 1, wherein an order in which the sequence of read reference voltages is applied is selected to avoid causing a saturated log-likelihood ratio (LLR) for the respective read window.

8. The method according to claim 1, wherein more than five hard reads are performed in an order where read reference voltages placed farther from the read reference voltage of the first hard read are applied first and read reference voltages placed closer to the read reference voltage of the first hard read are applied next in a predetermined fashion.

9. The method according to claim 8, wherein the order of read reference voltage placement is selected to avoid causing a saturated LLR with a wrong sign.

10. The method according to claim 1, wherein read reference voltages are placed asymmetrically around the read reference voltage of the first hard read based on a disparity of a prior hard-read page, and the disparity is determined as a ratio of a number of bits in the prior hard-read page having a value of one to a total number of bits in the prior hard-read page.

11. The method according to claim 10, wherein subsequent read reference voltages are placed in a direction to counter a bias of the disparity of prior reads dynamically.

12. The method according to claim 1, wherein a size of each respective read window is increased to improve a convergence probability.

13. The method according to claim 1, wherein for read operations in a multi-level cell (MLC) memory a state of an upper page is detected in a similar way as a state of a lower page, and read reference voltages for the upper page are placed in pairs in similar or opposite directions relative to the read reference voltages for the first hard read of the upper page.

14. An apparatus for applying a sequence of sensing/read reference voltages in a read channel, comprising;
a histogram generating circuit; and
a read voltage control circuit, wherein the read voltage control circuit
sets a respective read window for each respective threshold voltage of a set of threshold voltages defining different states of a memory storing multiple bits based on an estimate of the read channel, wherein each respective read window for each respective threshold voltage is set to encompass an intersection of two threshold voltage distribution tails associated with each respective threshold voltage,
sets a first value, a second value, and a third value of the sequence of read reference voltages for a first hard read, a second hard read and a third hard read of each respective read window, wherein the first value corresponds to a point central to the respective read window, and the second and third values correspond to different ones of a left-hand limit of the respective read window and a right-hand limit of the respective read window,
determines whether the first, the second and the third hard reads of each respective read window are successful based on histogram information from the histogram generating circuit, and
sets a fourth value and a fifth value of the sequence of read reference voltages for a fourth hard read and a fifth hard read of each respective read window if the first, the second and the third hard reads are not successful, the fourth value and the fifth value corresponding to different ones of (i) a point between the left-hand limit of the respective read window and the point central to the respective read window and (ii) a point between the right-hand limit of the respective read window and the point central to the respective read window.

15. An apparatus comprising:
a memory configured to store data; and
a controller configured to process a plurality of input/output requests to read/write to/from the memory, wherein the controller is configured to
set a respective read window for each respective threshold voltage of a set of threshold voltages defining different states of a memory cell storing multiple bits based on an estimate of a read channel of the memory, wherein the respective read window for each respective threshold voltage is set to encompasses an intersection of two threshold voltage distribution tails associated with each respective threshold voltage,
set a first value, a second value, and a third value of a sequence of read reference voltages for a first hard read, a second hard read and a third hard read of each respective read window, the first value corresponds to a point central to the respective read window, and the second and third values correspond to different ones of a left-hand limit of the respective read window and a right-hand limit of the respective read window,
determine whether the first, the second and the third hard reads of each respective read window are successful, and
if the first, the second and the third hard reads are not successful, set a fourth value and a fifth value of the sequence of read reference voltages for a fourth hard read and a fifth hard read of each respective read window, the fourth value and the fifth value corresponding to different ones of (i) a point between the left-hand limit of the respective read window and the point central to the respective read window and (ii) a point between the right-hand limit of the respective read window and the point central to the respective read window.

16. The apparatus according to claim 15, wherein the apparatus calculates an error value used by an error correction code (ECC) decoder.

17. The apparatus according to claim 15, wherein the memory includes a plurality of page signals each representing a bit sequence resulting from a plurality of hard reads at a plurality of read reference voltages.

18. The apparatus according to claim 15, wherein the memory comprises a non-volatile memory.

19. The apparatus according to claim 15, wherein the memory comprises a flash memory and the memory and the controller are part of a solid state drive (SSD).

20. The apparatus according to claim 15, wherein the controller configures the sequence of read reference voltages to avoid causing a saturated log-likelihood ratio (LLR) for each respective read window.

* * * * *